(12) United States Patent
Kawakami et al.

(10) Patent No.: US 9,318,248 B2
(45) Date of Patent: Apr. 19, 2016

(54) SPIN VALVE ELEMENT AND METHOD OF MANUFACTURING SAME

(75) Inventors: Haruo Kawakami, Mura (JP); Yasushi Ogimoto, Higashiyamato (JP); Eiki Adachi, Sagamihara (JP)

(73) Assignee: III HOLDINGS 2, LLC, Wilmington, DE (US)

( * ) Notice: Subject to any disclaimer, the term of this patent is extended or adjusted under 35 U.S.C. 154(b) by 337 days.

(21) Appl. No.: 12/739,741

(22) PCT Filed: Aug. 28, 2008

(86) PCT No.: PCT/JP2008/065407
§ 371 (c)(1),
(2), (4) Date: Jul. 28, 2010

(87) PCT Pub. No.: WO2009/054182
PCT Pub. Date: Apr. 30, 2009

(65) Prior Publication Data
US 2010/0291411 A1    Nov. 18, 2010

(30) Foreign Application Priority Data

Oct. 25, 2007  (JP) ................. 2007-277399

(51) Int. Cl.
*H01F 10/32* (2006.01)
*H01F 41/30* (2006.01)
*B82Y 25/00* (2011.01)
*B82Y 40/00* (2011.01)
*H01L 43/08* (2006.01)
*H01L 43/12* (2006.01)
*H01P 5/02* (2006.01)
*H03B 15/00* (2006.01)

(52) U.S. Cl.
CPC .............. *H01F 10/325* (2013.01); *B82Y 25/00* (2013.01); *B82Y 40/00* (2013.01); *H01F 10/3254* (2013.01); *H01F 41/302* (2013.01); *H01L 43/08* (2013.01); *H01L 43/12* (2013.01); *H01P 5/02* (2013.01); *H03B 15/006* (2013.01); *Y10T 428/1171* (2015.01)

(58) Field of Classification Search
None
See application file for complete search history.

(56) References Cited

U.S. PATENT DOCUMENTS 6,072,718 A * 6/2000 Abraham et al. ............. 365/173
6,717,777 B2 * 4/2004 Den et al. ..................... 360/324
(Continued)

FOREIGN PATENT DOCUMENTS

JP   H04348089     12/1992
JP   2002-084018 A  3/2002
(Continued)

OTHER PUBLICATIONS

Persson, J., Zhou, Y., and Akerman, J., J. Appl. Phys., 101, 09A503, 2007.*
Zou, Y., Persson, J., and Akerman, J., J. Appl. Phys., 101, 09A510, 2007.*
(Continued)

*Primary Examiner* — Kevin Bernatz
(74) *Attorney, Agent, or Firm* — McAndrews, Held & Malloy, Ltd.

(57) ABSTRACT

A spin valve element including parallelly or serially connected magnetic element groups, each magnetic element group having a plurality of magnetic elements that each include an intermediate layer of an insulating member or a nonmagnetic member sandwiched by a pair of ferromagnetic layers. The plurality of magnetic elements are further connected either in series or in parallel.

23 Claims, 3 Drawing Sheets

(56) References Cited

U.S. PATENT DOCUMENTS

| | | | |
|---|---|---|---|
| 6,829,161 B2 * | 12/2004 | Huai et al. | 365/158 |
| 7,224,601 B2 * | 5/2007 | Panchula | 365/158 |
| 7,652,915 B2 * | 1/2010 | Folks et al. | 365/171 |
| 2002/0064069 A1 * | 5/2002 | Goebel et al. | 365/173 |
| 2005/0100930 A1 | 5/2005 | Wang et al. | |
| 2005/0135020 A1 * | 6/2005 | Sugita et al. | 360/324 |
| 2006/0204794 A1 * | 9/2006 | Kikuchi et al. | 428/836.2 |
| 2007/0124532 A1 * | 5/2007 | Bennett | 711/100 |
| 2007/0236105 A1 * | 10/2007 | Mancoff et al. | 310/363 |
| 2008/0159046 A1 * | 7/2008 | Rinerson et al. | 365/226 |
| 2009/0115541 A1 * | 5/2009 | Persson et al. | 331/135 |
| 2010/0039105 A1 * | 2/2010 | Ryan et al. | 324/226 |
| 2011/0038198 A1 * | 2/2011 | Kent et al. | 365/158 |

FOREIGN PATENT DOCUMENTS

| | | |
|---|---|---|
| JP | 2004508653 | 3/2004 |
| JP | 2004-314238 A | 11/2004 |
| JP | 2005229099 A | 8/2005 |
| JP | 2006-075942 A | 3/2006 |
| JP | 2006-247795 A | 9/2006 |
| JP | 2007019179 | 1/2007 |
| JP | 2007-124340 A | 5/2007 |

OTHER PUBLICATIONS

Rufall, M., Rlppard, W., Russek, S., Kaka, S., and Katine, J., Phys. Rev. Let., 97, 087206, 2006.*

Grollier, J., Cros, V., and Fert, A., Phys. Rev. B, 73, 060409(R), 2006.*

F.B. Mancoff et al., "Phase-locking in double-point-contact spin-transfer devices", Nature, Sep. 15, 2005, vol. 437, p. 393-395.

V. Cros et al., "Synchronization of spin-transfer oscillators driven by stimulated microwave currents", Physical Review B, vol. 73, The American Physical Society, Feb. 24, 2006, p. 060409-1-060409-4.

Shehzaad Kaka et al., "Mutual phase-locking of microwave spin torque nano-oscillators", Nature, Sep. 15, 2005, vol. 437, p. 389-392.

S.I. Kiselev et al., "Microwave oscillations of a nanomagnet driven by a spin-polarized current", Nature, Sep. 25, 2003, vol. 425, p. 380-383.

XiaoMin Yang et al.,"Nanoscopic templates using self-assembled cylindrical diblock copolymers for patterned media", J. Vac. Sci. Technol. B 22(6). Nov./Dec. 2004, p. 3331-3334.

H. Masuda, "High-regularity metal nano-hole array based on anodic oxidized alumina", Kotai Butsuri, vol. 31, No. 5, pp. 493-499, 1996.

M.R. Pufall et al, "Electrical measurement of spin-wave interactions of proximate spin transfer nanooscillators", Physical Review Letters, vol. 97, Aug. 23, 2006, pp. 087206-1-087206-4.

Office Action issued by Japan Patent Office Sep. 6, 2013.

* cited by examiner

SPIN VALVE ELEMENT AND METHOD OF MANUFACTURING SAME

TECHNICAL FIELD

This invention relates to spin valve elements, and to a manufacturing method of such elements. More specifically, this invention relates to spin valve elements employing the tunneling magneto-resistance (TMR) effect or the giant magneto-resistance (GMR) effect, and to a method of driving such elements.

BACKGROUND ART

With recent advances in nanoelectronics, products are being developed which apply physical phenomena unique to magnetic materials with minute sizes. Of these, there have been particularly rapid advances in the field of spin electronics, which utilize the spin of free electrons in magnetic materials.

In the field of spin electronics, spin valve elements utilizing the tunneling magneto-resistance (TMR) effect occurring in a layered structure of a ferromagnetic layer, an insulating layer, and a ferromagnetic layer in order, or utilizing the giant magneto-resistance (GMR) effect occurring in a layered structure of a ferromagnetic layer, nonmagnetic layer (conducting layer), and a ferromagnetic layer in order, are currently regarded as having the greatest possibility of application.

FIG. 5 and FIG. 6 are cross-sectional views showing the configuration of spin valve elements of the prior art. Of these, FIG. 5 shows the basic constituent portions of a spin valve element utilizing TMR. This element has a configuration in which an insulating layer 24, and a ferromagnetic layer 23 (fixed layer) and ferromagnetic layer 25 (free layer) sandwiching the insulating layer, are formed on a substrate 5; to this are further added, as necessary, electrode layers 21, 27, an antiferromagnetic layer (pinning layer) 22, a capping layer 26, and similar. The direction of the magnetization of the fixed layer 23 is fixed by magnetic coupling with the antiferromagnetic layer 22 and similar. When electrons are passed from the fixed layer 23 toward the free layer 25 in this element, a torque acts to cause the magnetization of the free layer 25 to be aligned parallel to the direction of the magnetization of the fixed layer 23. Conversely, when electrons are passed from the free layer 25 toward the fixed layer 23, a torque acts on the magnetization of the free layer 25 so as to be antiparallel to the direction of the magnetization of the fixed layer 23. Consequently depending on the direction of the current in the free layer 25, the direction of magnetization of the free layer 25 can be controlled. This phenomenon of magnetization inversion by electron spin is called spin transfer magnetization reversal. For reasons described below, in conventional structures the size in in-plane directions of the magnetic layers in such an elements must be kept to very small sizes (approximately 150 nm or less), and expensive equipment such as electron beam exposure equipment is used.

In order to suppress the exchange coupling due to the leakage magnetic field from the film edge portions of the ferromagnetic layers 23 (fixed layer) and 25 (free layer) sandwiching the insulating layer 24, generally the portion on the side above the insulating layer 24 is made sufficiently smaller than that on the substrate side, and an insulating film 30 is formed on the periphery thereof. A number of methods may be used to form these structures; for example, after forming the layered film from the substrate to the electrode 27, applying a negative resist and performing exposure using a photolithography method, ion milling can be performed to expose the upper portion of the insulating layer 24, and thereafter an insulating layer 30 can be formed by covering with $SiO_2$ or similar, and after liftoff the electrode 27 to be used for wiring can be formed.

FIG. 6 shows the basic constituent portions of a spin valve element utilizing GMR. The difference between the element utilizing TMR of FIG. 5 and the element utilizing GMR is the replacement of the insulating layer 24 with a nonmagnetic layer 51; otherwise the configuration is basically the same.

Magnetic random access memory (MRAM) is attracting the most attention as an application of these technologies, and is drawing interest as a replacement for conventional DRAM (dynamic random access memory) and SRAM (synchronous DRAM).

Further, it is known that when an electric current and an external magnetic field are simultaneously applied to these spin valve elements, microwave oscillation occurs (see, for example, S. I. Kiselev, et al, "Microwave oscillations of a nanomagnet driven by a spin-polarized current", Nature, Vol. 425, p. 380 (2003)). For example with respect to the current direction, suppose that a current is passed such that the torque acts on the magnetization of the free layer 25 so as to become antiparallel to the direction of the magnetization of the fixed layer 23, and suppose that an external magnetic field causes a torque to act on the magnetization of the free layer 25 so as to become parallel to the direction of the magnetization of the fixed layer 23. In this case, under conditions in which the two torques are counterbalanced, high-frequency oscillation in the microwave region can be induced.

In addition, it has been reported that when two elements are formed adjacently and when currents and external magnetic fields appropriate to these are applied, the oscillation frequencies and phases of the two become coincident, the frequency width is decreased, and microwave output at this time is also increased (see, for example, Kaka, et al, "Mutual phase-locking of microwave spin torque nano-oscillators", Nature, Vol. 437, p. 389 (2005; F. B. Mancoff, et al, "Phase-locking in double-point-contact spin-transfer devices", Nature, Vol. 437, p. 393 (2005); J. Grollier, et al, "Synchronization of spin-transfer oscillator driven by stimulated microwave currents", Physical Review B73, p. 060409 (2006)). This phenomenon is called a phase locking phenomenon, and the mechanism, though not yet be clarified, is inferred to arise from interaction between the high-frequency magnetic fields occurring in each of the elements; this phenomenon is attracting attention as means of increased output.

In numerous reports, the oscillation output of the above microwave oscillator element stops at approximately 0.16 μW for TMR and at approximately 10 pW for GMR, which are very low levels for practical application. The simplest means to increase output is to increase the element area, but this is difficult for the following reason. That is, in spin valve elements, in order to facilitate coherent rotation of spins necessary for spin-transfer magnetization inversion, the magnetic films must comprise a single magnetic domain. For example, in order to obtain a single magnetic domain in the magnetic film the periphery of which is circumscribed on the left and right by the insulating film 30 in FIG. 5 and FIG. 6, the size circumscribed by the insulating film 30 on the left and right must be made small. In this way, the size of the element is required to be at most a size in which domain walls do not exist; although varying with material and shape, this size is approximately 150 nm. The size of a single conventional spin valve element cannot be made larger than this dimension.

Because there is an upper limit to the size of one spin valve element, in order to obtain a large output, numerous minute elements must be integrated. As means of integration, photolithography techniques are most widely used and have high precision; but in order to fabricate magnetic members with microminiature sizes (approximately 150 nm or less), investment in electron beam exposure and similar expensive equipment is necessary, so that there is the problem of high manufacturing costs.

Further, in "High-regularity metal nano-hole array based on anodic oxidized alumina", control of the size, pitch and depth of porous holes when manufacturing a porous alumina film from an aluminum film through manipulation of external conditions is disclosed (see H. Masuda, "High-regularity metal nano-hole array based on anodic oxidized alumina", Kotai Butsuri, Vol. 31, No. 5, p. 493, 1996). And, in "Nanoscopic templates using self-assembled cylindrical diblock co-polymers for patterned media", an invention is disclosed which is intended for applications in so-called bit-patterned media of hard disks (see X. M. Yang, et al, "Nanoscopic templates using self-assembled cylindrical diblock co-polymers for patterned media", J. Vac. Sci. Technol. B, Vol. 22, p. 3331 (2004)).

However, when numerous elements such as described above are connected in parallel, the overall impedance of the integrated element declines with the number of elements, that is, with increasing total area of the elements. However, in general in high-frequency circuits it is necessary to match impedances in order to suppress transmission losses. In the microwave region, generally input and output impedances are set to be 50Ω. Even when there are such input/output impedance settings, the oscillation output can be increased even when elements are connected in parallel as described above, but measures must be taken with respect to the overall electrical resistance, which declines as the number of elements increases. Further, there is the problem that if magnetic elements are simply connected in parallel, synchronized oscillation may not occur between these elements.

Further, in addition to parallel connection of spin valve elements, the oscillation output can also be increased through series connections. In the case of series connections, as the number of elements increases the overall electrical resistance increases. In order to use spin valve elements in series connections, a method in which photolithography is used to form numerous planar separate elements which are connected by separate wiring, and a method in which a separate substrate is used for wiring to connect elements, are conceivable. However, in methods in which numerous separate planar elements are formed by electron beam exposure or other means in widespread use, there is the same problem as in the prior art of the need to invest in expensive equipment, and in a method in which elements formed on a separate substrate are connected by wiring, there are such practical problems as an increase in the number of processes and limitations on the number of connected elements arising from limitations on the element dimensions.

In light of these circumstances, a low-cost method is sought for adjustment the element impedance and suppressing transmission losses of the oscillation microwaves.

Moreover, when spin valve elements are manufactured using porous film, there is an upper limit to the sizes of satisfactory porous films which can be obtained, and formation of spin valve elements of arbitrary area using porous film is difficult. Consequently even when a lower impedance is desired, broadening the spin valve element area to adjust the impedance is difficult.

DISCLOSURE OF THE INVENTION

In light of the above circumstances, this invention has as an object the provision, at low cost, of a large-output microwave oscillation element, in which numerous spin valve elements are integrated, and moreover element impedance is adjusted and transmission losses are suppressed.

In considering the fact that in order to synchronize microwave oscillation elements it is necessary that a plurality of microwave oscillation elements (spin valve elements) be arranged within a certain appropriate range and be driven simultaneously, the inventors of this application studied configurations with matching to prescribed impedances. As a result, it was discovered that even in cases in which separate spin valve elements oscillate in mutual synchronization, it is effective to connect a plurality of microwave oscillation elements in series or in parallel in order to perform impedance matching.

In this invention a spin valve element is provided, comprising a plurality of parallel magnetic element groups, formed by connecting in parallel a plurality of magnetic elements including at least three layers of an intermediate layer formed by an insulating member or a nonmagnetic member and a pair of ferromagnetic layers sandwiching the intermediate layer, the parallel magnetic element groups being connected together in series or in parallel. Further, in this invention a spin valve element is provided, comprising a plurality of series magnetic element groups, formed by connecting in series a plurality of magnetic elements of at least three layers of an intermediate layer formed by an insulating member or a nonmagnetic member and a pair of ferromagnetic layers sandwiching the intermediate layer, the series magnetic element groups being connected together in parallel.

The above inventions were devised from the discovery by the inventors that when a plurality of magnetic elements to be are caused to oscillate in synchronization, and moreover impedance matching is to be performed appropriately, these can be attained by means of a spin valve element (magnetic element) in which magnetic elements are connected in a combination of series and parallel connections. In a mode of this invention, magnetic elements can be placed in such proximity that mutual synchronization and generation of oscillation signals is possible. In this case, synchronized oscillation actually occurs in a plurality of spin valve elements, and factors affecting the impedance at this time are the interaction between spin valve elements based on the microwaves and other electromagnetic waves of the oscillation; however, the types cannot always be identified. Spin movement depends on the effective magnetic field and spin injection current acting on the spin, and oscillation synchronization phenomena are induced by the AC components of these. Of these, the interaction between series-connected spin valve elements may possibly be due to the AC component of the current, and does not depend on the distance between elements, but the interaction between parallel-connected spin valve elements is inferred to be due to the magnetic field arising from spin rotation, and the inventors of this application has confirmed that the mutual distance between spin valve elements plays an important role. In this case, it is preferable, for the purposes of synchronized oscillation and impedance matching, that the spin valve elements be arranged within a range approximately equal to the wavelength of the oscillation microwaves.

By means of any of the embodiments of the invention, impedance matching can be achieved while inducing the synchronized oscillation of a plurality of spin valve elements which undergo microwave or other high-frequency oscillation. Moreover, by means of any of the embodiments of this invention, a spin valve element can be manufactured using an inexpensive manufacturing process.

BEST MODE FOR CARRYING OUT THE INVENTION

Figure 1:
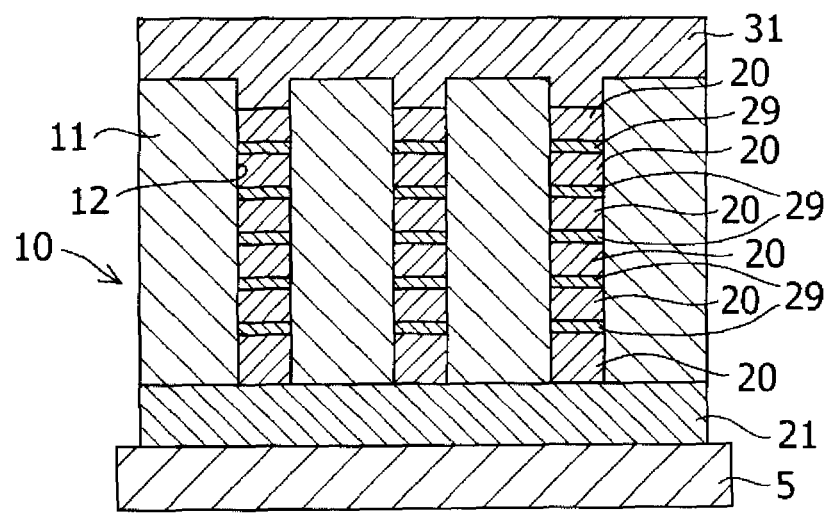
FIG. 1 is a vertical cross-sectional view showing the configuration of the spin valve element of a first embodiment of the invention.

In this invention, a plurality of spin valve elements are positioned in proximity, and are electrically connected together. As the method of formation of spin valve elements, conventional electron beam exposure or other techniques can be used. Below, embodiments of the invention are explained referring to the drawings.

First Embodiment

Figure 2:
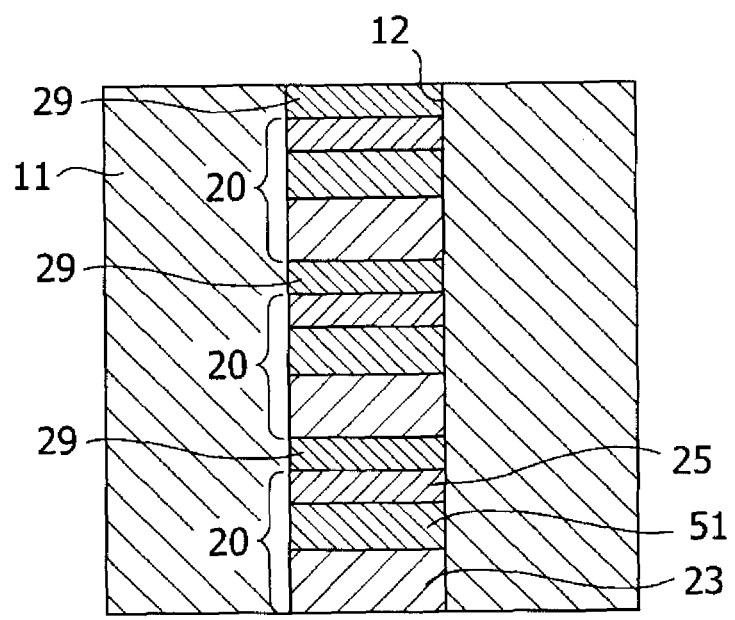
FIG. 2 is an enlarged cross-sectional view of principal portions, showing the configuration of the spin valve element of the first embodiment of the invention.

FIG. 1 is a vertical cross-sectional view showing the configuration of the spin valve element of a first embodiment of the invention, and FIG. 2 is an enlarged cross-sectional view of principal portions, showing the configuration of the spin valve element of the first embodiment. In this embodiment, as shown in the figures, a plurality of spin valve layers 20 are layered in a plurality of minute holes 12 formed in the insulating member 11 in a porous insulating layer 10 so as to be series-connected, and these can be connected in parallel by an electrode 31 and an electrode layer 21. Here, layered portions are shown in the figures, but in this invention a configuration is also possible in which a single spin valve layer 20 in the minute holes 12 is placed in each minute hole 12, and layering is not performed. The following description takes as an example a case in which the spin valve layers 20 have a GMR structure, but similar functions can be obtained in this embodiment even for a TMR structure.

As shown in FIG. 2, a spin valve layer 20 in this embodiment comprises a nonmagnetic layer 51 and a pair of ferromagnetic layers 23 (fixed layer) and 25 (free layer) which sandwich the nonmagnetic layer; as necessary, an antiferromagnetic layer (pinning layer), capping layer (neither shown), and similar may be layered onto for example one of the ferromagnetic layers 23. Within the minute holes 12 are layered magnetic elements comprising spin valve layers 20 having this structure and intermediate electrodes 29 as shown in FIG. 2; in the interior of each minute hole 12 is a group of series-connected magnetic elements (a series magnetic element group).

Electrodes 31, 21 are placed on the upper and lower faces of the series magnetic element groups in each minute hole 12; in this way, each of the series magnetic elements in each minute hole 12 are electrically connected with the outside of the minute hole 12. The electrodes 31, 21 connect a plurality of magnetic element groups in parallel.

Representative examples of the materials forming spin valve elements in the first embodiment include silicon substrate or glass substrate as the substrate 5; Ta, Pt, Cu, or Au as the electrode layers 21, 29, 31; IrMn or PtMn as the antiferromagnetic layer (not shown); Co, CoFe, or CoFeB as the ferromagnetic layer 23 (fixed layer); MgO or an Al oxide as the insulating layer 24; Cu as the nonmagnetic layer 51; Co, CoFe, CoFeB, or NiFe as the ferromagnetic layer 25 (free layer); and Cu or Pd as the capping layer (not shown). However, materials are not limited to these. By using the same material in the ferromagnetic layer 23 (fixed layer) and in the ferromagnetic layer 25 (free layer), and making the film thickness of the former greater than the film thickness of the latter, a spin valve function can be achieved through the difference in coercivities. In manufacturing, after layering each of the above materials, annealing treatment in a magnetic field is effective to adjust the crystallinity of each layer and the magnetic anisotropy of the fixed layer. Where necessary, the ferromagnetic layer 23 (fixed layer) and ferromagnetic layer 25 (free layer) can also be an antiferromagnetic coupled film of for example CoFeB/Ru/CoFeB or similar. Notation in which a plurality of materials are delimited by a slash (/) indicates a multilayer film in which layers of the materials are layered in that order.

Methods of forming the porous insulating layer 10 include for example treatment to perform anodic oxidation of an aluminum film, treatment to form microstructures in a resin film by self-organization, and treatment to transfer a microstructure by a nanoimprinting technique. Any of these methods can be used to form minute holes with uniform shape by means of an inexpensive process. In particular, if nanoimprinting is used, minute holes can be formed with a high aspect ratio (ratio of the hole depth to the hole diameter), which is preferable for forming a layered structure with many layers. Nanoimprinting also has the advantage of facilitating control over shape.

Figure 3:
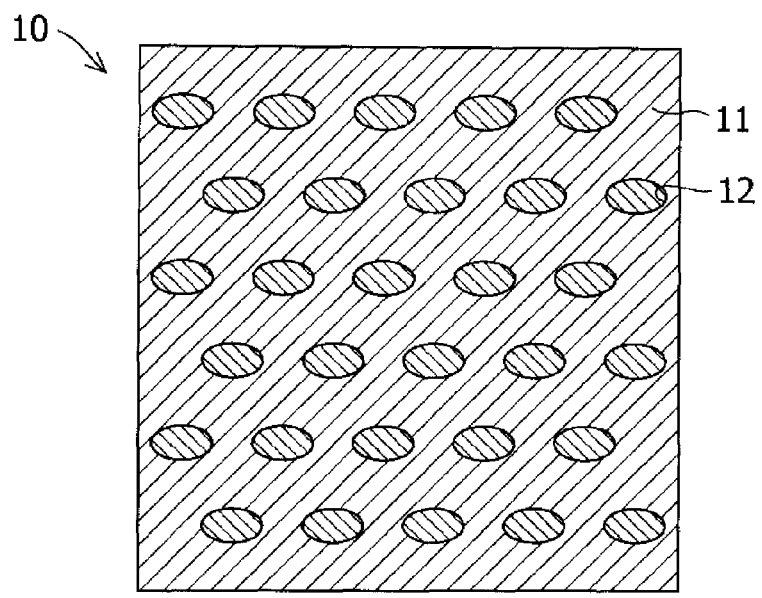
FIG. 3 is a horizontal cross-sectional view showing the configuration of the spin valve element of the first embodiment of the invention.

FIG. 3 is a horizontal cross-sectional view of the porous insulating layer 10 showing this example. In general in a spin valve element, the magnetic films are often formed into an elliptical shape for the purpose of controlling the direction of the in-plane anisotropy of the magnetic films, but a shape such as that shown in FIG. 3 can also be formed easily.

Differing from this, in anodic oxidation treatment of aluminum film the minute hole shapes are circular, and it is difficult to control the in-plane anisotropy direction of the magnetic films. However, when using perpendicular magnetization types in which the crystal anisotropy is aligned in the direction perpendicular to the film plane, the limits to such shape controllability do not pose a problem, and this invention can be implemented. Further, in microstructure formation treatment by self-organization of a resin as well, the minute hole shapes are normally circular, which is advantageous for perpendicular magnetization types in which the crystal anisotropy is aligned in the direction perpendicular to the film plane. In resin self-organization, minute holes are obtained with an aspect ratio higher than that for nanoimprinting techniques, and the method is suitable for obtaining layered structures with many layers.

As a method of manufacturing a porous insulating layer 10 using nanoimprinting, for example a thermoplastic resin such as polymethyl methacrylate or similar is applied to a substrate, after which heating is performed at a temperature higher than the glass transition point of the thermoplastic resin to soften the thermoplastic resin, and then a stamper is pressed to transfer the relief pattern of the stamper. By cooling the substrate, a porous insulating layer 10 having a prescribed minute hole structure can be obtained on the substrate. The stamper material is generally silicon, quartz, silicon carbide, tantalum, or similar; for use in this invention, silicon, which can be micro-machined, is particularly appropriate. In order to improve the release properties of the stamper and the polymer layer, it is preferable that a fluoride polymer and surfactant be applied to the stamper surface. As the material of the porous insulating layer 10, an ultraviolet ray hardening resin can be used; after pressing the stamper, photohardening can be performed, to eliminate the processes of heating and cooling the substrate.

As a polymer for use in this nanoimprinting method, polymethyl methacrylate, polystyrene, polycarbonate, and other thermoplastic resins, 1,6-hexane diol diacrylate, bis hydroxy ethyl-bis-phenol A-dimethylacrylate, and similar may be used; however, materials which can be used as porous films in this invention are not limited to these.

By means of this nanoimprinting method, if within the range in which the stamper machining precision is obtained, the relief pattern can be accurately transferred. Compared with machining of separate elements by electron beam lithography or similar, manufacturing costs are far more inexpensive. There may be cases in which there are upper limits to the range over which the stamper machining precision can be maintained or upper limits to the size of a stamper with high machining precision, or cases in which cost is extremely high at large sizes. Hence the range over which appropriate minute holes 12 are obtained in the porous film 10 is necessarily limited. In this embodiment, individual spin valve elements (magnetic elements) are manufactured having an area extending over the range in which such appropriate minute holes 12 are obtained. And, spin valve elements manufactured in island shapes are connected together as in FIG. 4 such that the impedance is the desired value. By this means, the trade-off between cost and performance with respect to the maximum size and the relief pattern accuracy of a stamper can be resolved while keeping impedance matching.

The technique of subjecting an aluminum film to anodic oxidation treatment to obtain a porous alumina film is itself a technique already in use, but the technique for fabricating the nanometer-order minute holes required has not yet been practically applied. In methods using anodic oxidation treatment, in essence the external conditions are manipulated to control the size, pitch and depth of the porous holes (see, for example, H. Masuda, "High-regularity metal nano-hole array based on anodic oxidized alumina", Kotai Butsuri, Vol. 31, No. 5, p. 493, 1996). By means of this method, nanometer-order minute holes can be formed densely in two dimensions. In particular, a porous alumina layer has high heat resistance, and so is sufficiently durable with respect to the annealing treatment necessary for a spin valve structure, explained below, and is therefore preferable with respect to the processes of this invention.

As the method of manufacturing the porous alumina layer 10, first an aluminum film is formed by a sputtering method or another method. As necessary heat treatment can be performed in an inert gas or in vacuum at 400 to 500° C. to coarsen the crystal grains and decrease crystal grain boundaries, so that the order of arrangement of minute holes in the porous alumina layer can be improved. Thereafter, an aqueous solution of $H_3PO_4$ or $H_2SO_4$, or similar, is used to perform electrolytic polishing, to flatten the surface. Anodic oxidation treatment is performed using for example oxalic acid as the electrolytic solution, and by using a constant voltage of approximately 30 to 60 V as the formation voltage, minute holes are formed, regularly arranged and with high density. The regularity of arrangement of these minute holes advances with the passage of time in the anodic oxidation treatment, so that by performing anodic oxidation treatment over a long period of time, highly regular, densely arranged minute holes can be formed. Further, the intervals between minute holes formed by anodic oxidation treatment can be controlled through the applied voltage, and is approximately 2.8 nm/V. That is, when 40 V is applied, the intervals are approximately 112 nm. The ratio of intervals to diameters of minute holes depends on the electrolytic solution and the treatment temperature, but can be adjusted within the range of approximately 1.5 to 5. As one example, the diameter per unit voltage when using oxalic acid as the electrolytic solution was approximately 4.9 nm/V, so that when 40V is applied, the diameter is approximately 23 nm.

In a porous alumina layer 10 obtained as described above, numerous minute holes are formed in a regular arrangement, and the holes are formed perpendicularly to the surface of the porous alumina layer 10, but the bottom portions are closed, forming cylindrical spaces. When minute holes with elliptical cross-sections are formed, in order to penetrate these holes, after anodic oxidation treatment, immersion treatment in $H_3PO_4$ or similar must be performed.

In recent years, there have been efforts to develop technology to manufacture porous insulating layers 10 utilizing phenomena in which a microstructure is formed through resin self-organization, aiming at applications in so-called bit patterned media of hard disks (see, for example, X. M. Yang, et al, "Nanoscopic templates using self-assembled cylindrical diblock co-polymers for patterned media", J. Vac. Sci. Technol. B, Vol. 22, p. 3331 (2004)). In this technology, in essence a solution of two types of non-miscible polymers is applied onto a substrate, and after heat treatment to induce phase separation of the polymers, one of the polymers is removed by chemical means to obtain a minute hole structure. Normally, this method can be used to obtain minute holes several tens of nanometers in diameter, at a pitch of several tens of nanometers.

As a method of manufacturing a porous insulating layer 10 utilizing self-organization of a resin, for example a polystyrene-methyl methacrylate (PS-PMMA) copolymer is dissolved in toluene or another solvent, and this is applied onto a substrate by spin-coating or another method. Here, copolymer components of approximately PS:PMMA=70:30 are appropriate for obtaining a porous structure. The spin-coating conditions and solvent concentration can be adjusted as appropriate depending on the film thickness of the porous insulating layer 10 which is desired; for example, to obtain a thickness of 40 to 50 nm, a spin-coating revolution rate of 1800 to 2400 rpm and a solid component concentration of 1 to 3% by weight are desirable. Then, upon annealing in vacuum for several hours at 170° C., the polystyrene (PS) and polymethyl methacrylate (PMMA) undergo phase separation. One of the polymers (in the above material, PMMA) is selectively removed, to obtain a porous structure. In the case of the above composition, after irradiation with ultraviolet light to degrade the PMMA, washing with glacial acetic acid and water is performed to remove the PMMA, so that holes of diameter 20 nm at a pitch of approximately 40 nm can be obtained.

In order to form minute holes with a high aspect ratio perpendicularly to the substrate, the substrate may be treated with a self-organizing film or similar in advance, to adjust the surface energy of the substrate. As the polymers used in this method, polystyrene (PS), polymethyl methacrylate (PMMA), polyisoprene, polylactide, and similar are used, but polymers which may be used are not limited to these.

The intervals between the minute holes formed by the above method can be controlled mainly through the copolymer component ratio. The diameters of the minute holes are determined by the ratio of surface energies of the polymer materials at the time of phase separation, and are controlled by the copolymer materials, the solvent, the annealing temperature, and other factors.

A porous insulating layer 10 formed by nanoimprinting or by resin self-organization comprises a polymer material, and in general has poor heat resistance. For this reason, after having formed the magnetic multilayer structure and electrodes in the minute holes, it is effective to remove the porous insulating layer 10, cover the remaining minute columnar structures of magnetic multilayer film with $SiO_2$ or another inorganic insulating layer, and then polish the surface to expose the electrodes, to form a porous insulating layer 10 with high heat resistance. This means is made necessary by the process of annealing of the spin valve elements in particular. As the means of covering with $SiO_2$ or another inorganic insulating material, CVD, or application of TEOS (tetraethoxysilane, $Si(OC_2H_5)_4$) followed by heat treatment for conversion into $SiO_2$, or other means can be used.

The intervals between minute holes of the porous layer can be chosen arbitrarily; the inventors have discovered, with respect to the effect of increasing output through phase locking between spin valve elements in particular, that this originates in the interaction due to the electromagnetic fields of microwaves from oscillation of each of the spin valve elements. Hence in order to obtain this effect, a distance between the spin valve elements approximately equal to the wavelength of the microwaves equivalent thereto is sufficient. That is, if the microwaves have frequency 20 GHz, for example, then the wavelength in the atmosphere is approximately 15 mm, and so an increase in the output of spin valve elements within this range due to phase locking can be expected. Moreover, even at distances equal to or greater than this, if the elements are connected by electrical wiring, a similar effect can be obtained.

Second Embodiment

Figure 4:
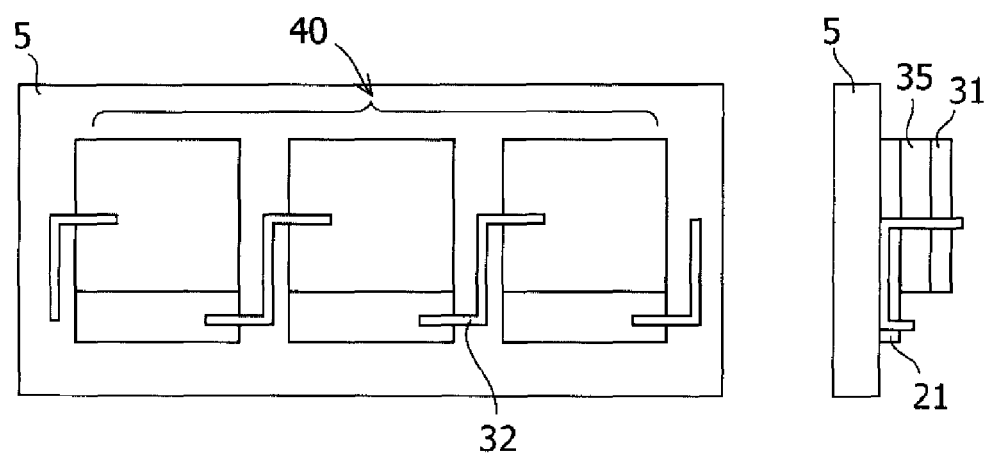
FIG. 4 is a vertical cross-sectional view showing the configuration of the spin valve element of a second embodiment of the invention.
Figure 5:
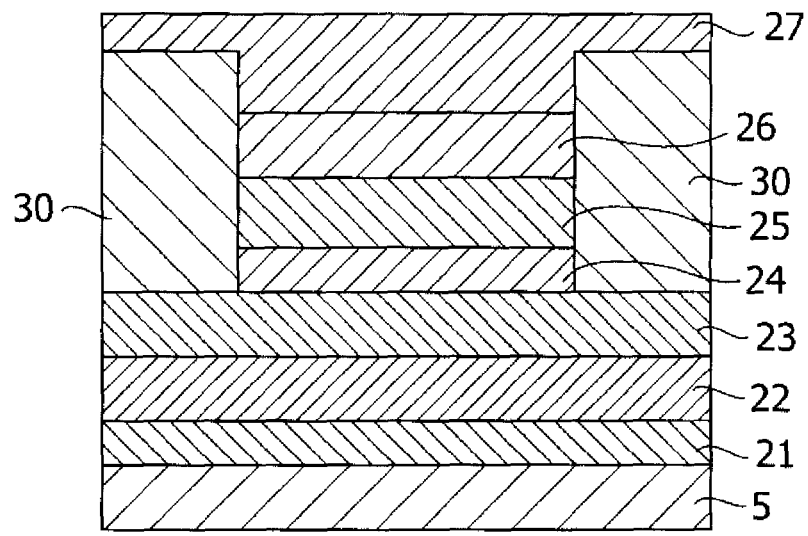
FIG. 5 is a cross-sectional view showing the configuration of a spin valve element of the prior art.
Figure 6:
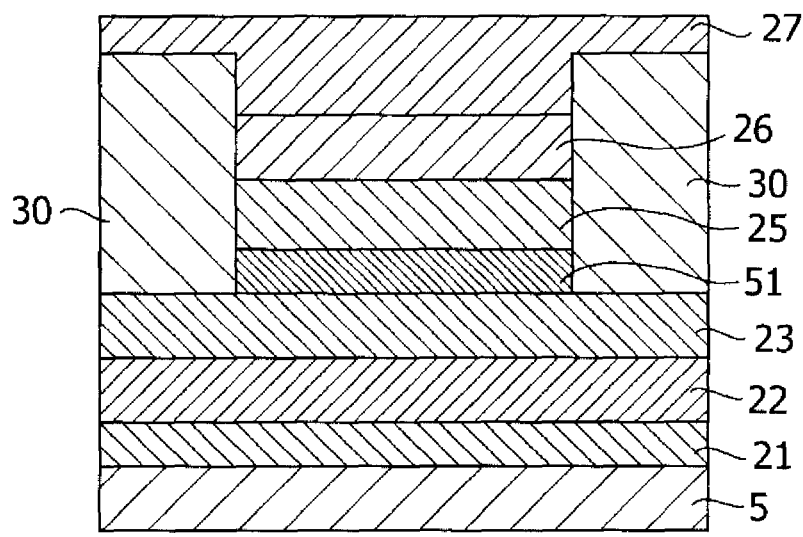
FIG. 6 is a cross-sectional view showing the configuration of a spin valve element of the prior art.

FIG. 4 shows one example of the spin valve element of a second embodiment of the invention. In the spin valve element of the second embodiment, integrated spin valve elements, obtained for example by the above method, are separated into island shapes approximately several micrometers on a side on a substrate, within a range which overall is approximately 100 μm. And, these spin valve elements are connected in parallel or in series on the substrate, and the entirety is used as a spin valve element. As explained above, the dimensions of separate spin valve elements (magnetic elements) must be approximately 150 nm or less, and the wiring between these elements requires expensive investments in electron beam exposure or other equipment. The second embodiment of the invention adopts a configuration in which a spin valve element group, in which are integrated several hundred to several thousand elements, are formed at once, and a plurality of element groups are provided and these groups are wired. By adopting this structure, the individual elements of element groups can be manufactured without using lithography. By this means, wiring and entire element groups can be formed using inexpensive visible light exposure, and a configuration is possible in which adequate performance is obtained through patterning using visible light. Individual spin valve element groups separated into island shapes may have a simple parallel structure in which single-layer spin valves are formed in minute holes, or can have a series-parallel structure in which layered spin valve elements are formed in minute holes, as in the first embodiment. When single-layer spin valve elements are formed, each island-shape spin valve element group is a parallel magnetic element group. At this time, individual island-shape magnetic elements having a parallel element group can be further connected in parallel. In the case for example of a single magnetic element having the same area as the sum of all the magnetic elements, if within this area there is a short-circuited portion at even a single place, the entirety is short-circuited; but by separating into a number of groups and connecting in parallel only islands which have been inspected without problem, the pass rate can be improved.

The impedance of individual spin valve elements depends on the film thickness and the element area, but in the case of TMR is approximately 50Ω to 1.5 MΩ, and in the case of GMR is approximately 5 to 50Ω, so that in order to make the impedance of the entire element 50Ω, it is appropriate that the ratio (number of series connections):(number of parallel connections) be 1:100 to 1:30,000 for TMR, and be 1:1 to 10:1 for GMR.

In this way, using a porous insulating layer, a spin valve layer can be formed in the minute holes thereof to obtain an inexpensive spin valve element. And, by layering a plurality of spin valve layers in the minute holes, series-structure spin valve elements can be obtained; and in addition, by arranging these in a parallel structure, a series-parallel structure spin valve element can be obtained. Or, by grouping a plurality of spin valve elements formed in parallel on a substrate, and by series-connecting these at once, the lithograph precision required can be lowered and manufacturing costs can be reduced. By means of these configurations, the number of parallel connections and the number of series connections of spin valve layers can be arbitrarily selected, so that the impedance of the spin valve element can easily be adjusted.

In this way, numerous spin valve elements can be integrated, and moreover the element impedance can be adjusted and transmission losses suppressed, to provide a high-output microwave oscillator element at low cost.

Below, a practical example of each of the above embodiments is explained.

Practical Example 1

Using the structure of the First Embodiment, a TMR layer was first fabricated by the following procedure. Following each of the materials, the film thickness of the layer is indicated in parentheses. A Cu (80 nm) thin film was formed on the silicon substrate 5 by a sputtering method as the electrode layer 21. Then, $Co_{20}Fe_{30}$ (20 nm) as the ferromagnetic layer 23, MgO (0.6 nm) as the insulating layer 24, $Co_{40}Fe_{40}B_{20}$ (2 nm) as the ferromagnetic layer 25, Cu (2 nm) as the capping layer (not shown), and Pt (10 nm) as the intermediate electrode layer 29, were layered in order, to obtain one spin valve layer 20. And, by repeating this process, a total of five spin valve layers were layered.

Next, negative resist was applied onto the uppermost face of the spin valve layers, and elliptical regions were irradiated with an electron beam so as to form regions arranged in a honeycomb pattern of ellipses with major axis of 120 nm×minor axis of 60 nm, and with hole centers at distances of 320 nm. By this means resist remained in the ellipse patterns, and a negative resist pattern arrangement was obtained. And, ion milling was performed using this resist pattern to remove all five layers of the spin valve layers immediately below the regions without resist. Then, in order to form the insulating member 11 (FIG. 1, FIG. 2), a CVD method was used to form an $SiO_2$ film. After removing the resist on the spin valve element by lift-off, a negative resist was again applied, photolithography was used to obtain a plurality of 6 μm diameter resist patterns, and by using these to remove regions in which there was no resist, 6 μm diameter islands were obtained. Approximately 176 spin valve layer structures were formed within one 6 μm diameter island. After separating the resist on the 6 μm diameter islands, sputtering was used to layer Cu and form an upper electrode 31, and annealing was performed at 350° C. in a magnetic field of approximately 4 kOe to fabricate a sample of Practical Example 1. The electrical resistance of the spin valve layers 20 in this configuration was approximately 1.77 kΩ per layer, or a total of approximately 8.85 kΩ for five layers; and as a result of parallel-connecting the approximately 176 minute holes in a 6 μm diameter island with the electrode 21 and electrode 27, the electrical resistance for an entire island was approximately 50Ω.

Practical Example 2

A Cu (80 nm) thin film was formed by sputtering as an electrode layer 21 on a silicon substrate 5. Then, a toluene solution of polymethyl methacrylate (solid component concentration 3%) was applied by spin-coating and dried to obtain a polymethyl methacrylate thin film (thickness 120 nm). Then, this was heated at approximately 120° C., and by pressing a silicon stamper, a porous film structure, in which a pattern of minute elliptical 120 nm×60 nm holes were arranged in a honeycomb structure with a distance between hole centers of 400 nm (FIG. 3), was transferred and fabricated. Then, photoresist was applied to the porous film, and exposure performed to form a plurality of holes of diameter 6 μm. Within the 6 μm diameter islands were formed approximately 112 minute holes. Then, ion etching was used to remove the bottom portions and form penetrating holes.

Then, sputtering was used to layer, in order in the minute holes 12, $Co_{70}Fe_{30}$ (20 nm) as the ferromagnetic layer 23, MgO (0.8 nm) as the insulating layer 24, $Co_{40}Fe_{40}B_{20}$ (2 nm) as the ferromagnetic layer 25, and Cu (2 nm) as the capping layer (not shown), to obtain one spin valve layer 20, after which Pt (10 nm) was further layered as an intermediate electrode layer 29. By repeating this process, a total of three spin valve layers were layered. The photoresist was then separated and removed.

Then, Cu was layered by sputtering as the upper electrode layer 31, filling the minute holes 12, after which the remaining polymer was removed by oxygen plasma treatment, to form spin valve layered column structures. Further, after injecting TEOS (tetraethoxysilane) in the space between layered column structures, heat treatment at 400° C. was performed to convert the material to $SiO_2$, to pack the space of the layered column structures with $SiO_2$ and cover the layered column structures. Then, the surface was polished to expose the Cu of the upper electrode layer 31. By means of this process, the material comprised by the porous insulating layer 10 was converted from a polymer into $SiO_2$ having heat resistance. After extending the upper electrode 31 to the upper portion of the porous insulating layer 10, annealing was performed at 350° C. in a magnetic field of approximately 4 kOe, to obtain a sample of Practical Example 2.

As a result, the number of minute holes in a 6 μm diameter island of this configuration was approximately 112, the electrical resistance of the spin valve layer 20 was approximately 13.0 kΩ per layer and was approximately 39.0 kΩ for three layers, and the electrical resistance for an entire island was approximately 348Ω. In this case, by parallel-connecting seven islands, approximately 50Ω was obtained as the overall impedance of the element. Wiring between islands was formed by application of a negative resist and an ordinary photolithography method using visible light for exposure processing, followed by sputtering to form Al wiring lines.

Practical Example 3

Apart from a number of modifications, a sample of Practical Example 3 was manufactured similarly to that of Practical Example 2. The modifications were as follows. The solid component concentration of the toluene solution of polymethyl methacrylate was 5% in spin coating. The film thickness at this time was 1200 nm. By this means, a porous layer 10 of polymethyl methacrylate was formed. Here, the elliptical minute holes had a honeycomb structure pattern, with a distance of 200 nm between hole centers. And, division was performed by lift off, so as to obtain islands with a diameter of 6 μm. By this means, the number of minute holes in each island was approximately 450. And, within the minute holes 12 formed in the porous layer 10, spin valve layers were formed as follows.

First, electroplating was used to layer in order, in minute holes 12, $Ni_{80}Fe_{20}$ (20 nm) as the ferromagnetic layer 23, Cu (6 nm) as the nonmagnetic layer 51, $Ni_{80}Fe_{20}$ (2 nm) as the ferromagnetic layer 25, and Cu (2 nm) as the capping layer 26, then the 30 spin valve layers to form a spin valve layer utilizing GMR, after which Pt (10 nm) was formed as the intermediate electrode layer 29. The annealing conditions were 250° C. in a 4 kOe magnetic field, but otherwise, the sample of Practical Example 3 was fabricated similarly to that of Practical example 2. The layered thickness from the substrate to the upper portion of the porous insulating layer 10 was approximately 1200 nm.

The electrical resistance for a spin valve layer 20 with this configuration was 22.9Ω per layer, and the total for 30 spin valve layers was 687Ω; the electrical resistance for an entire island was approximately 1.53Ω. And, by series-connecting 33 islands, an impedance of approximately 50Ω was obtained for the entire element.

Practical Example 4

The sample of Practical Example 4 was fabricated by a method substantially similar to that of Practical Example 1. Similarly to Practical Example 1, sputtering was used to form Cu (80 nm) thin film as the electrode layer 21 on a silicon substrate 5. And, the sample of Practical Example 4 was obtained by a method similar to that of Practical Example 1, except that $Co_{70}Fe_{30}$ (20 nm) as the ferromagnetic layer 23, an MgO layer (0.6 nm) as the insulating layer 24, NiFe (4.5 nm) as the ferromagnetic layer 25, Cu (2 nm) as the capping layer 26, and Pt (10 nm) as the intermediate electrode layer 29 were layered in order, and by repeating this process, a total of three spin valve layers were layered; the dimensions of the elliptical fine hole patterns was 30×50 nm, and the distances between hole centers in the honeycomb structure was 140 nm; the dimensions of the divided islands were 2 μm in diameter, and a total of eight of these islands were formed on the same substrate; and the arrangement was in four rows and two columns, at a 100 μm pitch. Approximately 100 minute holes were formed in a 2 μm diameter island, and for a total of eight islands, 800 layered spin valve elements were formed.

The electrical resistance for a spin valve layer 20 with this configuration was 13.5 kΩ per layer, and the total for three layers was approximately 40.5 kΩ; the electrical resistance for an entire island was approximately 405Ω. And, by parallel-connecting eight islands, an impedance of approximately 50Ω was obtained for the entire element.

Practical Example 5

The sample of Practical Example 5 was fabricated by a method substantially similar to that of Practical Example 1. After treating a silicon substrate 5 with an OTS (octadecyltrichlorosilane) self-organization film, a polystyrene-methyl methacrylate (PS-PMMA) copolymer thin film was applied by spin coating. That is, a toluene solution of a polystyrene-methyl methacrylate copolymer (manufactured by Polymer Science Inc., PS:PMMA=70:30) (solid component concentration 5% by weight) was applied at a spin coating revolution rate of 900 rpm, to obtain a thin film of thickness 4800 nm. Then, by performing annealing for three hours at 170° C. in vacuum, the polystyrene (PS) and the polymethyl methacrylate (PMMA) phases were separated. Then irradiation with ultraviolet light was performed to degrade the polymethyl methacrylate (PMMA), after which washing with glacial acetic acid and water were performed for selective removal, to obtain a porous structure in which minute holes were arranged regularly in a honeycomb structure. The minute holes were perpendicular to the substrate and cylindrical in shape, and had a diameter of approximately 20 nm and pitch of approximately 40 nm.

Then, electroplating was used to layer in order, in minute holes 12, Ru (5 nm)/$Co_{20}Fe_{30}$ (20 nm) as the ferromagnetic layer 23, Cu (6 nm) as the nonmagnetic layer 51, NiFe (4.5 nm) as the ferromagnetic layer 25, Cu (2 nm) as the capping layer 26, and Pt (10 nm) as the intermediate electrode layer 29, to obtain a single spin valve layer 20. By repeating this process, a total of 100 spin valve layers were layered. Then, after using sputtering to layer Cu as the upper electrode layer 31 and filling the minute holes 12, means similar to that of Practical Example 2 was used to convert the material comprised by the porous insulating layer 10 from a polymer to $SiO_2$ having heat resistance. After using sputtering to layer Cu and extend the upper electrode 31 to the upper portion of the porous insulating layer 10, annealing was performed at 250° C. in a magnetic field of approximately 4 kOe, to fabricate the sample of Practical Example 5. The layered thickness from the substrate to the upper portion of the porous insulating layer 10 was approximately 4800 nm.

The electrical resistance for a spin valve layer 20 with this configuration was 310Ω per layer, and the total for 100 spin valve layers was approximately 31 kΩ. Upon forming islands with area such that the diameter was 2 μm, 1250 minute holes existed in one island, and the impedance for an island was approximately 24.8 kΩ. And, by series-connecting two of these islands, an impedance of approximately 50Ω was obtained for the entire element.

By subjecting the samples of Practical Examples 1 through 5 to a 1 T DC magnetic field in the direction parallel to the magnetic field of the fixed layer, and passing a DC current in the direction such that electrons flow from the free layer into the fixed layer, microwave oscillation was obtained. Measurement results are shown in Table 1.

TABLE 1

| | Element resistance (Ω) | Number of spin valve layers | Driving voltage (V) | Total input (W) | Individual element output (W) | Total output (W) | Frequency (GHz) |
|---|---|---|---|---|---|---|---|
| Practical Example 1 | 50 | 8.8E+02 | 5 | 5.0E−01 | 1.5E−06 | 1.3E−03 | 23.4 |
| Practical Example 2 | 50 | 2.4E+03 | 15 | 4.7E+00 | 1.4E−06 | 3.3E−03 | 17.8 |
| Practical Example 3 | 50 | 4.5E+05 | 0.27 | 1.6E+00 | 9.0E−11 | 4.0E−05 | 26.3 |
| Practical Example 4 | 51 | 2.4E+03 | 3 | 1.9E−01 | 1.8E−06 | 4.3E−03 | 13.6 |
| Practical Example 5 | 50 | 2.5E+05 | 0.9 | 7.1E−02 | 1.4E−10 | 3.5E−05 | 14.7 |

As shown in FIG. 1, by means of this invention, from several thousands to several hundred thousand spin valve elements could be combined, with the overall impedance matched to approximately 50Ω, to fabricate a microwave oscillator element with high output (from 35 μW to 1.8 mW). This is a large improvement over conventional single-element output (0.16 μW when using TMR, approximately 10 pW when using GMR). Further, as the average output for each spin valve layer in each minute hole in this invention, 1.5 μW, 1.4 μW, and 1.8 μW respectively were obtained in Practical Examples 1, 2 and 4 using TMR, and 90 pW were obtained in Practical Example 3 using GMR, so that large improvements were obtained for single elements as well. The reason for this is inferred to arise from the phase locking phenomenon observed when a plurality of elements are formed in proximity, as explained above.

In the above, embodiments of the invention have been described, but the invention is not limited to the embodiments described, and various modifications, alteration, and combinations are possible, based on the technical concepts of the invention. By means of the invention, numerous spin valve elements can be integrated, and the element impedance can be adjusted to suppress transmission loss, to provide at low cost a high-output microwave oscillator element.

The invention claimed is:

1. A spin valve element, comprising:
   a plurality of serially or parallelly-connected magnetic element groups, wherein each magnetic element group is formed, at least in part, by connecting in parallel a plurality of magnetic elements, and wherein each magnetic element includes an intermediate layer and a pair of ferromagnetic layers sandwiching the intermediate layer; and
   a single porous layer having a plurality of minute holes, wherein each of the plurality of magnetic elements is disposed within one of the plurality of minute holes of the single porous layer, and wherein the plurality of magnetic elements is connected in parallel outside of the minute holes;
   wherein:
   each of the pair of ferromagnetic layers has a predetermined thickness; and a ratio of a total number of serial connections of the magnetic elements to a total number of parallel connections of the magnetic elements is:
    in a range of 1:100 to 1:30,000 if the spin valve element utilizes a tunneling magneto-resistance (TMR) effect; and
    in a range of 1:1 to 10:1 if the spin valve element utilizes a giant magneto-resistance (GMR) effect.

2. The spin valve element of claim 1, wherein the plurality of magnetic elements are placed in such proximity that oscillation signals are configured to be generated if the plurality of magnetic elements are mutually synchronized.

3. The spin valve element of claim 1, wherein the single porous layer is formed by nanoimprinting.

4. The spin valve element of claim 1, wherein the intermediate layer is an insulating layer or an electrically-conductive nonmagnetic layer.

5. The spin valve element of claim 1, wherein the serial connections and the parallel connections are configured such that the spin valve element has an impedance of 500.

6. The spin valve element of claim 1, wherein each of the pair of ferromagnetic layers is the same material.

7. The spin valve element of claim 6, wherein the pair of ferromagnetic layers comprises a fixed layer and a free layer, and wherein the predetermined thickness of the fixed layer is greater than the predetermined thickness of the free layer.

8. The spin valve element of claim 1, wherein the plurality of serially or parallelly-connected magnetic element groups are serially-connected magnetic element groups.

9. The spin valve element of claim 1, wherein the plurality of serially or parallelly-connected magnetic element groups are parallelly-connected magnetic element groups.

10. The spin valve element of claim 1, wherein the plurality of serially or parallelly-connected magnetic element groups are formed on the same substrate.

11. A spin valve element manufacturing method of manufacturing the spin valve element according to claim 1, comprising a step of forming the single porous layer by nanoimprinting.

12. A spin valve element manufacturing method of manufacturing the spin valve element according to claim 1, comprising a step of forming the single porous layer by either:
    a step of performing anodic oxidation of an aluminum thin film; or
    a step of causing self-organization of a resin film.

13. A spin valve element, comprising:
    a plurality of parallelly-connected magnetic element groups, wherein each magnetic element group is formed, at least in part, by connecting in series a plurality of magnetic elements, and wherein each magnetic element includes an intermediate layer and a pair of ferromagnetic layers sandwiching the intermediate layer; and
    a single porous layer having a plurality of minute holes, wherein each of the plurality of magnetic element groups is disposed within one of the plurality of minute holes of the single porous layer, and wherein the plurality of magnetic element groups is connected in parallel outside of the minute holes;
wherein:
    each of the pair of ferromagnetic layers have a predetermined thickness; and
    a ratio of a total number of serial connections of the magnetic elements to a total number of parallel connections of the magnetic elements is:
        in a range of 1:100 to 1:30,000 if the spin valve element utilizes a tunneling magneto-resistance (TMR) effect; and
        in a range of 1:1 to 10:1 if the spin valve element utilizes a giant magneto-resistance (GMR) effect.

14. The spin valve element of claim 13, wherein the plurality of magnetic elements are placed in such proximity that oscillation signals are configured to be generated if the plurality of magnetic elements are mutually synchronized.

15. A spin valve element group, comprising a plurality of the spin valve elements according to claim 13, wherein the spin valve elements are connected in series.

16. The spin valve element group of claim 15, wherein the single porous layer is formed by nanoimprinting.

17. The spin valve element group of claim 15, wherein the spin valve elements are formed on the same substrate.

18. The spin valve element of claim 13, wherein the intermediate layer is an insulating layer or an electrically-conductive nonmagnetic layer.

19. The spin valve element of claim 13, wherein the serial connections and the parallel connections are configured such that the spin valve element has an impedance of 500.

20. The spin valve element of claim 13, wherein each of the pair of ferromagnetic layers is the same material.

21. The spin valve element of claim 20, wherein the pair of ferromagnetic layers comprises a fixed layer and a free layer, and wherein the predetermined thickness of the fixed layer is greater than the predetermined thickness of the free layer.

22. A spin valve element manufacturing method of manufacturing the spin valve element of claim 13, comprising a step of forming the single porous layer by nanoimprinting.

23. A spin valve element manufacturing method of manufacturing the spin valve element according to claim 13, comprising a step of forming the single porous layer by either:
    a step of performing anodic oxidation of an aluminum thin film; or
    a step of causing self-organization of a resin film.

* * * * *